United States Patent
Lee et al.

(10) Patent No.: US 10,736,243 B2
(45) Date of Patent: Aug. 4, 2020

(54) COOLING MODULE FOR PARALLEL TYPE POWER MODULE OF INVERTER

(71) Applicants: Hyundai Motor Company, Seoul (KR); Kia Motors Corporation, Seoul (KR)

(72) Inventors: Je-Hwan Lee, Seongnam-si (KR); Han-Geun Jang, Seoul (KR); Eun-Cheol Lee, Hwaseong-si (KR); Seong-Min Lee, Hwaseong-si (KR); Yun-Ho Kim, Seoul (KR); Sang-Cheol Shin, Suwon-si (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 0 days.

(21) Appl. No.: 16/219,503

(22) Filed: Dec. 13, 2018

(65) Prior Publication Data
US 2020/0029473 A1    Jan. 23, 2020

(30) Foreign Application Priority Data
Jul. 17, 2018   (KR) .................. 10-2018-0082858

(51) Int. Cl.
*H01L 25/00*    (2006.01)
*H05K 7/20*    (2006.01)
*F28D 1/03*    (2006.01)

(52) U.S. Cl.
CPC ....... *H05K 7/20927* (2013.01); *F28D 1/0341* (2013.01); *H05K 7/20945* (2013.01)

(58) Field of Classification Search
CPC ........... H05K 7/20927; H05K 7/20945; H05K 7/209; H05K 7/1432; H05K 7/2089; H05K 7/20254; H05K 1/0203; H05K 7/20872; F28D 1/0341; H01L 2924/00; H01L 2924/13055; H01L 2924/13091; H01L 2924/1305; H01L 2924/1306;
(Continued)

(56) References Cited

U.S. PATENT DOCUMENTS 7,200,007 B2 *   4/2007   Yasui .................... H02M 7/003
                                                    165/80.4
2005/0259402 A1 *   11/2005   Yasui .................... H02M 7/003
                                                    361/716
(Continued)

FOREIGN PATENT DOCUMENTS

KR    10-2009-0054738 A    6/2009

*Primary Examiner* — Mandeep S Buttar
(74) *Attorney, Agent, or Firm* — Morgan, Lewis & Bockius LLP

(57) ABSTRACT

A cooling module for a parallel type power module of an inverter may include parallel type power modules configured to be disposed in three or more columns and rows, wherein three parallel type power modules are disposed to correspond to U, V, and W phases of the inverter in the three or more rows in each of the three or more columns, a first cooling water passage having a passage through which cooling water flows and configured to be brought into contact with an upper surface and a lower surface of a power module disposed at a first row, and a second cooling water passage having a passage through which the cooling water flows and configured to be brought into contact with an upper surface and a lower surface of a power module disposed at a third row.

11 Claims, 13 Drawing Sheets

(58) Field of Classification Search
CPC ..... H01L 23/473; H01L 23/34; H01L 25/115; H01L 25/117; H02K 11/33; H02K 5/20; H02K 1/20
USPC ........... 361/699, 688, 702, 704; 363/141, 40
See application file for complete search history.

(56) References Cited

U.S. PATENT DOCUMENTS

2007/0076355 A1* 4/2007 Oohama .............. H01L 25/117
361/676
2009/0231811 A1* 9/2009 Tokuyama .............. H01L 23/36
361/699

* cited by examiner

US 10,736,243 B2

COOLING MODULE FOR PARALLEL TYPE POWER MODULE OF INVERTER

CROSS-REFERENCE(S) TO RELATED APPLICATIONS

The present application claims priority to Korean Patent Application No. 10-2018-0082858, filed on Jul. 17, 2018, the entire contents of which is incorporated herein for all purposes by this reference.

BACKGROUND OF THE INVENTION

Field of the Invention

The present invention relates to a cooling module for cooling a power module of an inverter for a vehicle. More particularly, it relates to a cooling module for a parallel type power module.

Description of Related Art

Eco-friendly vehicles, such as hybrid electric vehicles (HEVs) and electric vehicles (EVs) which use electric motors as driving sources, generally use high voltage batteries as energy sources for driving the electric motors and require inverters which provide power to the electric motors as power conversion parts.

The inverter is provided to convert three-phase direct current (DC) power of the high voltage battery between the electric motor and the high voltage battery into three-phase alternating current (AC) power and provide the three-phase AC power to the electric motor.

A power module is provided at the inverter and is configured with a semiconductor switch made of an insulated gate bipolar transistor (IGBT) and a diode to transfer a high voltage and a high current to the electric motor through fast switching. At the present point, the flowing high current causes a loss, and the present loss heats the semiconductor switch to generate high heat, increasing a junction temperature of the semiconductor switch.

Furthermore, the inverter may include a cooler for cooling the heat caused by the fast switching loss of the power module.

However, to prevent burning of the semiconductor switch and maintain a durability lifespan thereof, a maximum temperature of the semiconductor switch may always be kept within 175° C.

Therefore, a logic shown in FIG. 1 is applied to HEVs or EVs to accurately control a temperature T_junction of the semiconductor switch within 175° C.

When input parameter values (a load current, an input voltage, and a variable frequency) determining a driving condition are determined, a power loss occurs according to the input parameter values, and a delta temperature of a junction is determined by multiplying the input parameter values by a thermal resistance value and a final temperature is obtained by adding the delta temperature to a water temperature, which is read from a water temperature sensor, such that the temperature T_junction of the semiconductor switch is controlled to be always within 175° C.

The junction temperature may be predicted within a temperature deviation of 5° C. even under conditions of a variable switching frequency, variation in input voltage, and variation in load current.

As shown in FIG. 2, it may be seen that the junction temperature of the power module is determined by an applied current.

Recently, as the line-up of eco-friendly vehicles expands, an amount of current in a high-performance vehicle has rapidly increased such that a conventional power module cannot manage the rapidly increased amount of current.

Therefore, a required current may be managed through a parallel driving of power modules.

FIG. 3 schematically illustrates a parallel type power module and a parallel type cooling module.

An exemplary parallel type power module has a configuration in which three-row parallel power modules P1, P2, and P3 respectively correspond to three U, V, and W phases of an inverter, and an exemplary parallel type cooling module has a structure in which an inlet and an outlet are provided in opposite directions and cooling passages L1, L2, L3, and L4 are also configured in parallel.

Such a parallel type cooling module has two problems. As shown in FIG. 4, the first problem is that, a flow rate LPM of each of the cooling passages L1, L2, L3, and L4 is reduced to 1/n according to the number of parallel cooling passages such that thermal resistance is degraded, and as shown in FIG. 5, the second problem is that, as a water temperature at an outlet side (the W phase) rises, the water temperature of the W phase is inevitably higher than that at an inlet side (the U phase).

Since a factor determining specifications of an inverter is a maximum temperature, the specifications of the inverter are restricted by a temperature of the W phase.

The information included in this Background of the Invention section is only for enhancement of understanding of the general background of the invention and may not be taken as an acknowledgement or any form of suggestion that this information forms the prior art already known to a person skilled in the art.

BRIEF SUMMARY

Various aspects of the present invention are directed to providing a cooling module for a parallel type power module of an inverter, which is configured for efficiently cooling the parallel type cooling module of the inverter.

Other objects and advantages of the present invention may be understood by the following description and become apparent with reference to the exemplary embodiments of the present invention. Also, it is obvious to those skilled in the art to which the present invention pertains that the objects and advantages of the present invention may be realized by the means as claimed and combinations thereof.

In accordance with various exemplary embodiments of the present invention, a cooling module for a parallel type power module of an inverter, which may include parallel type power modules configured to be disposed in three or more columns and rows, wherein three parallel type power modules are disposed to correspond to U, V, and W phases of the inverter in the three or more rows in each of the three or more columns, a first cooling water passage having a passage through which cooling water flows and configured to be brought into contact with an upper surface and a lower surface of a power module disposed at a first row, and a second cooling water passage having a passage through which the cooling water flows and configured to be brought into contact with an upper surface and a lower surface of a power module disposed at a third row.

The first cooling water passage may be brought into contact with an upper surface of a power module disposed at a second row, and the second cooling water passage may be brought into contact with a lower surface of the power module disposed at the second row.

The first cooling water passage may include a first inlet passage through which the cooling water flows in, a first upper cooling passage configured to communicate with the first inlet passage and to be brought into contact with the upper surface of the power module disposed at the first row, a first U-turn passage configured to communicate in a downward direction from a distal end portion of the first upper cooling passage, a first lower cooling passage configured to communicate from the first U-turn passage and to be brought into contact with a lower surface of the power module disposed at the first row and the upper surface of the power module disposed at the second row, and a first outlet passage configured to communicate from a distal end portion of the first lower cooling passage and through which the cooling water flows out.

The second cooling water passage may include a second inlet passage through which the cooling water flows in, a second upper cooling passage configured to communicate with the second inlet passage and to be brought into contact with the lower surface of the power module disposed at the second row and the upper surface of the power module disposed at the third row, a second U-turn passage configured to communicate in a downward direction from a distal end portion of the second upper cooling passage, a second lower cooling passage configured to communicate from the second U-turn passage and to be brought into contact with the upper surface of the power module disposed at the third row, and a second outlet passage configured to communicate from a distal end portion of the second lower cooling passage and through which the cooling water flows out.

The first inlet passage and the second inlet passage may communicate with each other through the same inlet hole, and the first outlet passage and the second outlet passage may communicate with each other through the same outlet hole.

The first inlet passage may communicate with the first upper cooling passage, the second inlet passage may communicate with the second upper cooling passage, the first outlet passage may communicate with the first lower cooling passage, and the second outlet passage may communicate with the second lower cooling passage.

The parallel type power modules may be disposed in six rows, and the cooling module may further include a third cooling water passage having a passage through which the cooling water flows and configured to be brought into contact with an upper surface and a lower surface of a power module disposed at a fourth row, and a fourth cooling water passage having a passage through which cooling water flows and configured to be brought into contact with an upper surface and a lower surface of a power module disposed at a sixth row.

The cooling module may further include a first inlet side support block configured to support the first inlet passage on an upper surface thereof, a second inlet side support block configured to support the second inlet passage on an upper surface thereof, a first outlet side support block configured to support the first outlet passage on an upper surface thereof, and a second outlet side support block configured to support the second outlet passage on an upper surface thereof, wherein the inlet hole may be formed in the first inlet side support block and the second inlet side support block, and the outlet hole may be formed in the first outlet side support block and the second outlet side support block.

The second inlet side support block and the second outlet side support block may be integrally formed.

The cooling module may further include a first U-turn side support block configured to support the first upper cooling passage, the first lower cooling passage, and the second upper cooling passage, and to be divided into an upper space and a lower space, wherein the first U-turn passage is formed in the upper space and the second U-turn passage is formed in the lower space.

The cooling module may further include a U-turn side middle block configured to support the second lower cooling passage.

The methods and apparatuses of the present invention have other features and advantages which will be apparent from or are set forth in more detail in the accompanying drawings, which are incorporated herein, and the following Detailed Description, which together serve to explain certain principles of the present invention.

Figure 1:
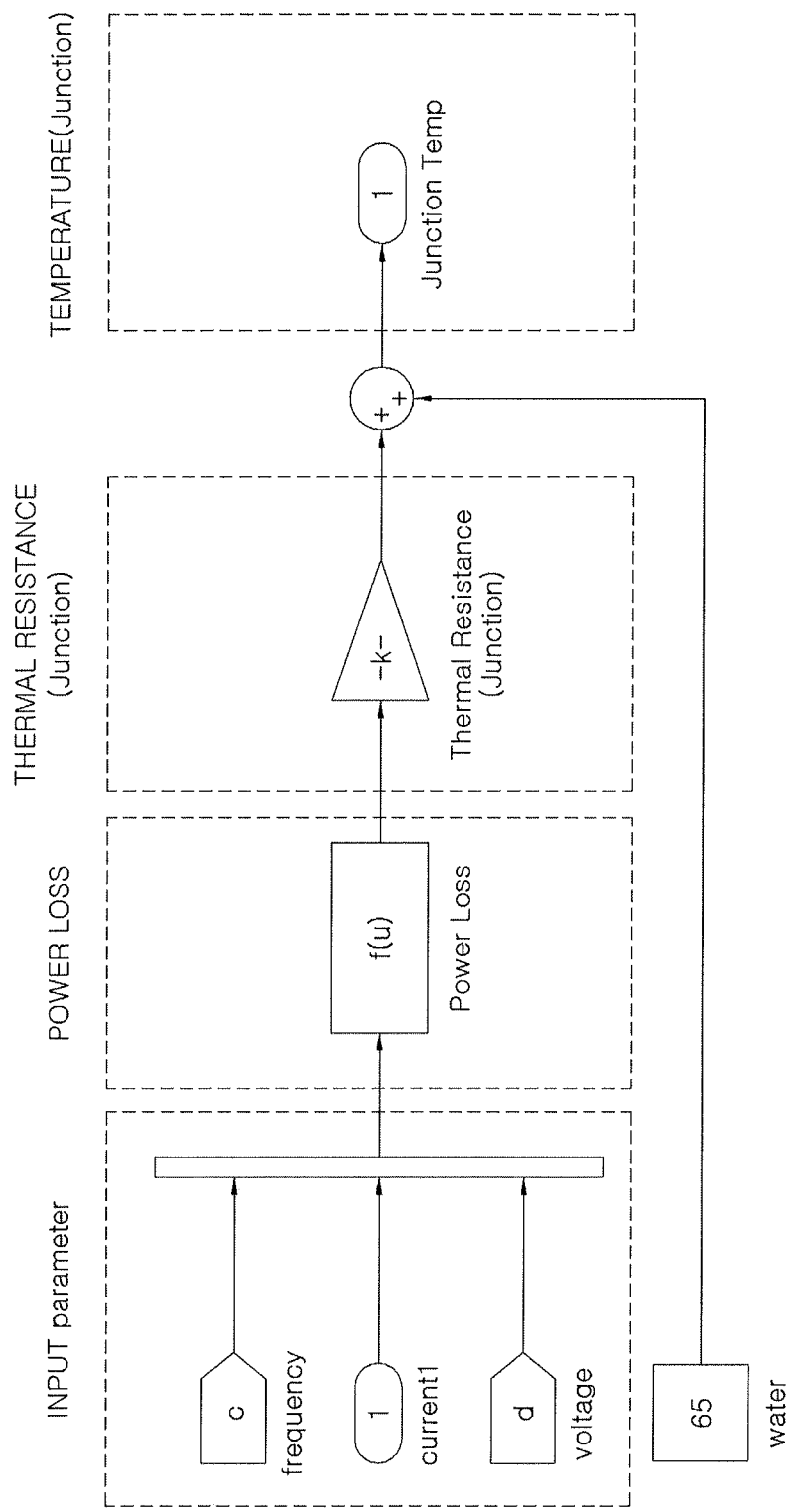
FIG. 1 is a diagram illustrating a logic for a temperature management of a semiconductor switch.
Figure 2:
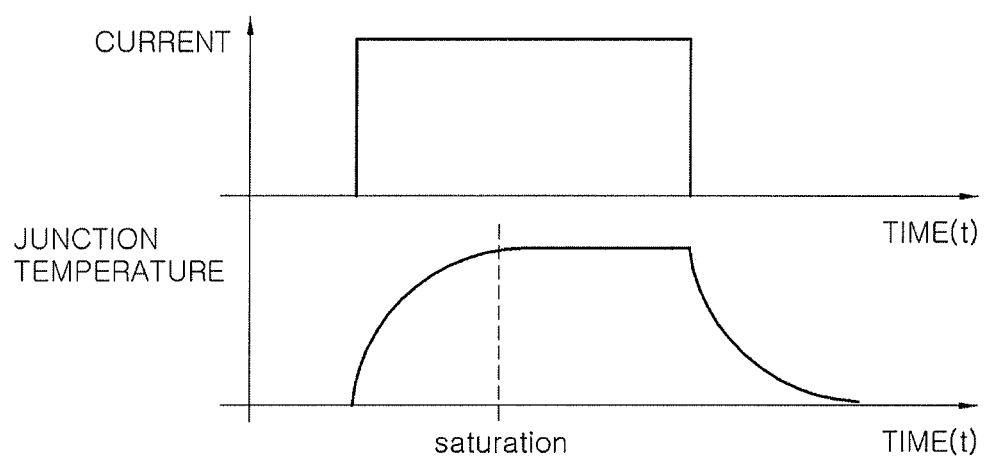
FIG. 2 is a graph showing a relationship between a junction temperature of a power module and a current applied to the power module.

It may be understood that the appended drawings are not necessarily to scale, presenting a somewhat simplified representation of various features illustrative of the basic principles of the present invention. The specific design features of the present invention as included herein, including, for example, specific dimensions, orientations, locations, and shapes will be determined in part by the particularly intended application and use environment.

In the figures, reference numbers refer to the same or equivalent parts of the present invention throughout the several figures of the drawing.

DETAILED DESCRIPTION

Reference will now be made in detail to various embodiments of the present invention(s), examples of which are illustrated in the accompanying drawings and described below. While the present invention(s) will be described in conjunction with exemplary embodiments of the present invention, it will be understood that the present description is not intended to limit the present invention(s) to those exemplary embodiments. On the other hand, the present invention(s) is/are intended to cover not only the exemplary embodiments of the present invention, but also various alternatives, modifications, equivalents and other embodiments, which may be included within the spirit and scope of the present invention as defined by the appended claims.

Reference may be made to the accompanying drawings that illustrate exemplary embodiments of the present invention, and to the description in the accompanying drawings to fully understand the present invention and operational advantages of the present invention, and objects attained by practicing the present invention.

In various exemplary embodiments of the present invention, known technologies or detailed descriptions may be reduced or omitted to avoid obscuring appreciation of the disclosure by a person of ordinary skill in the art.

The present invention is a cooling module for cooling a parallel type power module, and as described above, it may be seen that it is difficult to achieve excellent performance by a simplified parallel cooling method.

Figure 6:
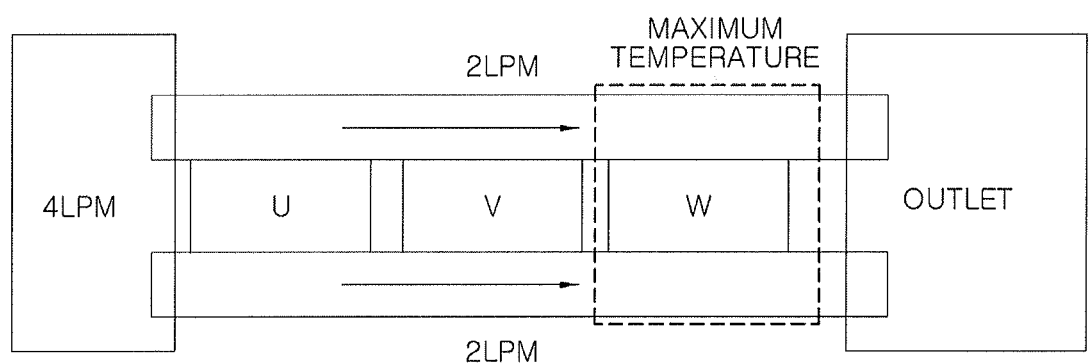
FIG. 6 is a diagram conceptually illustrating a parallel type cooling.
Figure 7:
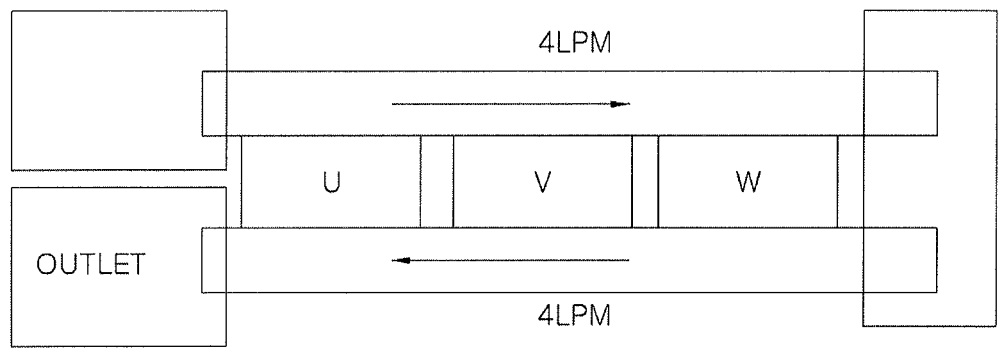
FIG. 7 is a diagram conceptually illustrating a serial type cooling.

To derive an efficient cooling method, the cooling methods of FIG. 6 and FIG. 7 will be compared and described.

FIG. 6 is a diagram conceptually illustrating a parallel type cooling, and FIG. 7 is a diagram conceptually illustrating a serial type cooling.

Advantages and disadvantages of the cooling methods of FIG. 6 and FIG. 7 may be summarized as the following Table 1.

TABLE 1

| | Cooling method | |
|---|---|---|
| | Parallel type cooling (FIG. 6) | Serial type cooling (FIG. 7) |
| Outlet temperature | The same rise in temperature | |
| Influence of rise in water temperature at outlet side | Greater than serial type cooling | Greater than parallel type cooling (reduction by 40% in rise of water temperature) |
| Cooling performance | Thermal resistance ↑ and pressure loss ↓ | Thermal resistance ↓ and pressure loss ↑ (reduction by 8% in thermal resistance) |
| Deviation per phase | Outlet side and W phase inferiority | Excellence in deviation per phase |

As summarized in Table 1, in terms of the cooling performance and the influence of the rise in water temperature at the outlet side, it may be concluded that a serial structure is more advantageous than a parallel structure.

Figure 8:
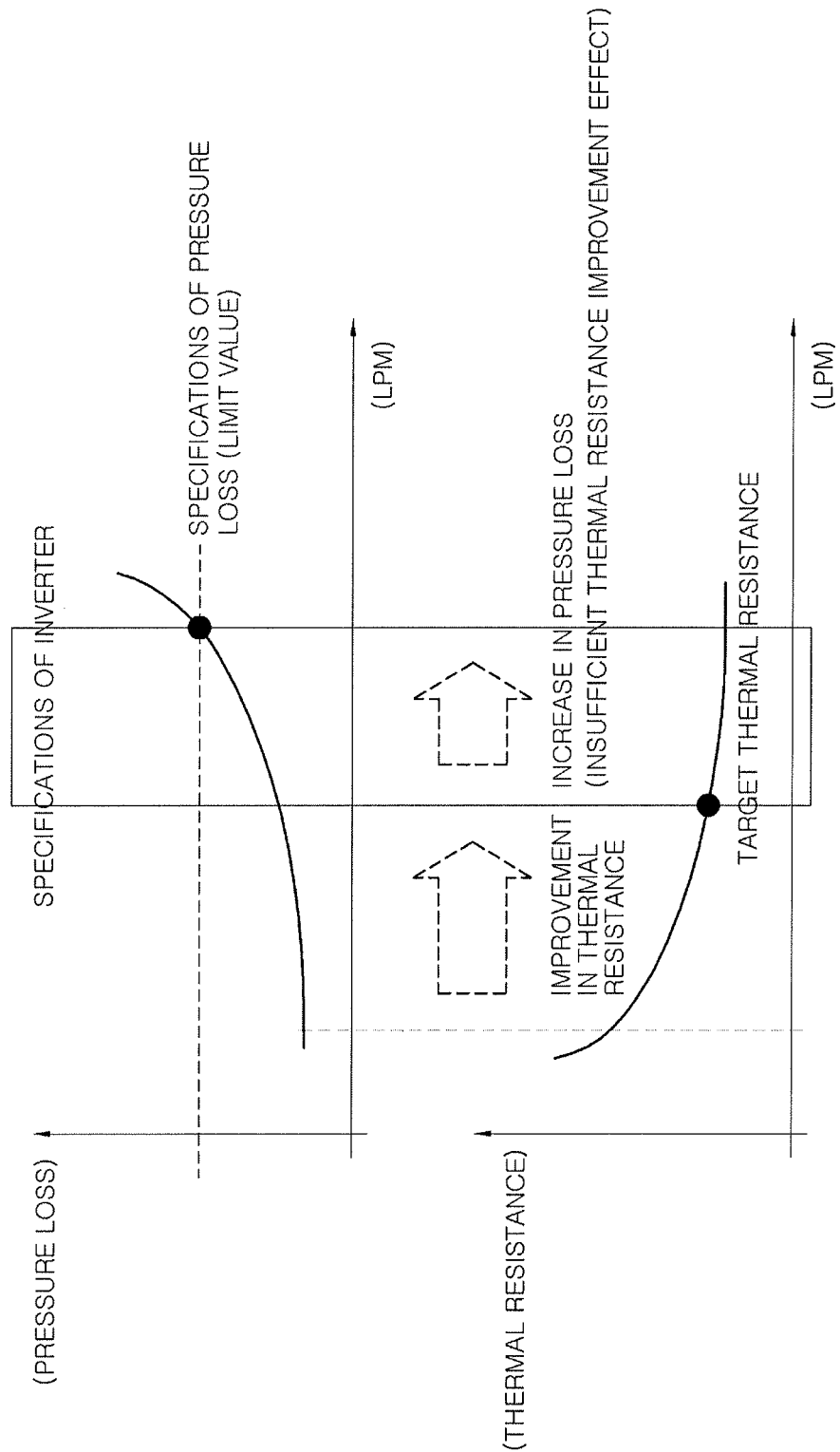
FIG. 8 is a graph showing a limit point of the serial type cooling of FIG. 7.

However, when a cooling module is configured in the serial structure under a parallel driving condition of a power module, there is an advantage in that the thermal resistance is reduced and the influence of the rise in water temperature is reduced as an LPM becomes larger, but as shown in FIG. 8, the pressure loss increases exponentially so that it may be seen that a serial and parallel operation strategy is required in a section configured for managing a pressure loss of a system.

That is, the thermal resistance decreases as the LPM increases, but improvement is significantly reduced when the LPM reaches a certain section, and thus when a target thermal resistance is satisfied, an increase in LPM is unnecessary over the certain section such that the increase in LPM may be considered in selecting of the number of serial configurations.

To verify efficiency of a serial-parallel type method of the cooling module on the basis of the above-described consideration result, a description will be made with reference to FIG. 9, FIG. 10, FIG. 11 and FIG. 12.

FIG. 9, FIG. 10, FIG. 11 and FIG. 12 are examples of a cooling structure which is available in three parallel-driven power modules.

Figure 9:
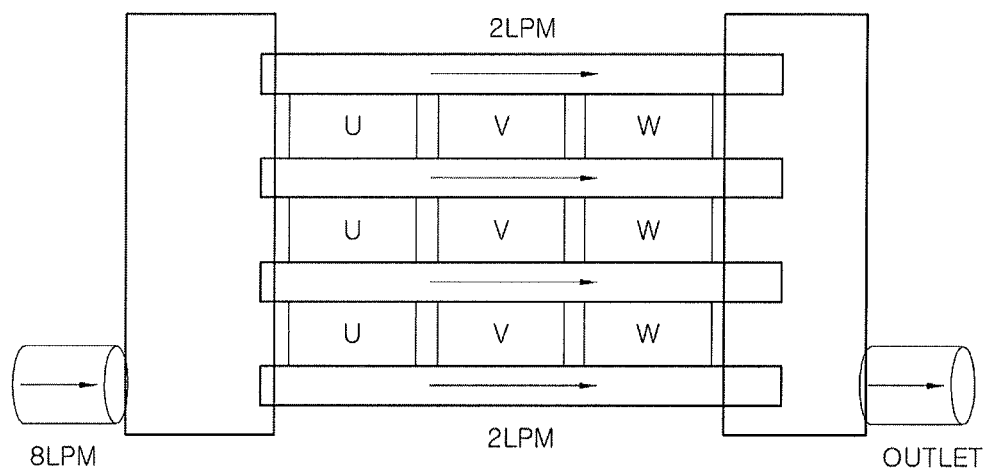
FIG. 9, FIG. 10, FIG. 11 and FIG. 12 are diagrams illustrating a cooling method available in a three-parallel driving.
Figure 10:
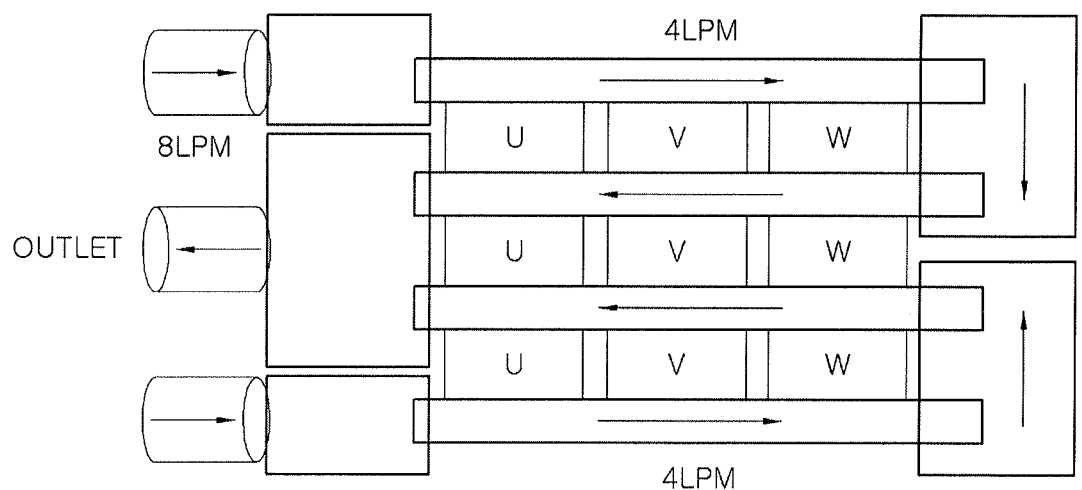
Figure 11:
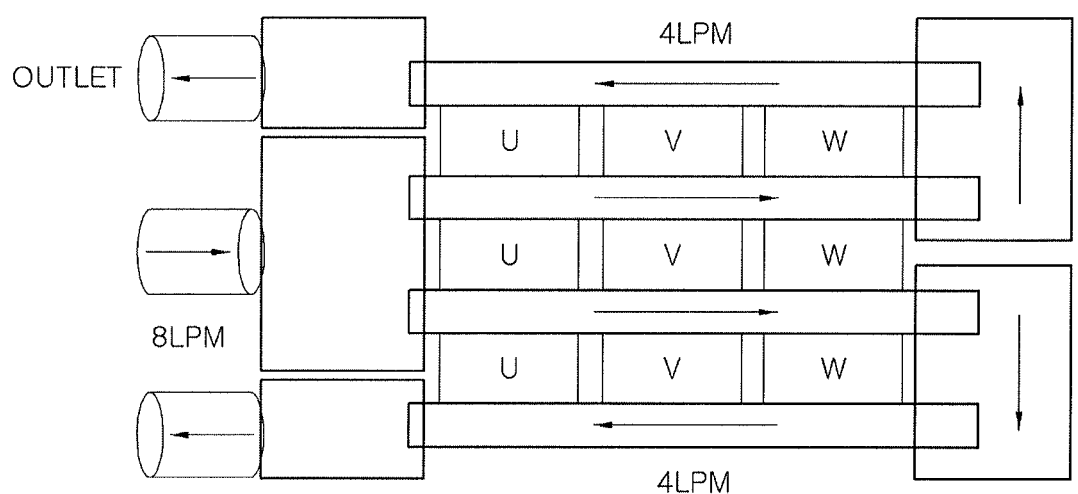
Figure 12:
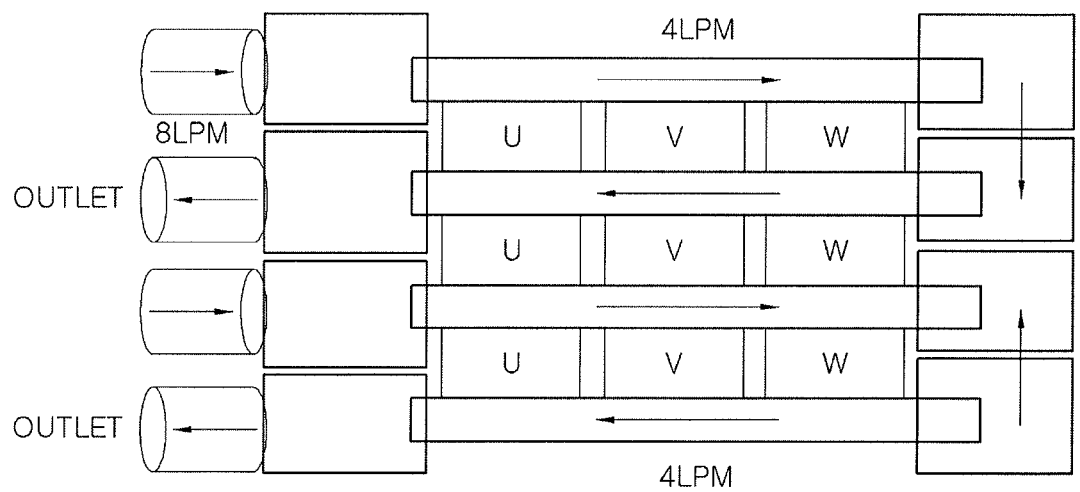

FIG. 9 illustrates a cooling module having a simplified parallel structure, FIG. 10 illustrates an example of a cooling module having a serial-parallel combined structure, FIG. 11 illustrates another example of the cooling module having the serial-parallel combined structure, and FIG. 12 illustrates yet another example of the cooling module having the serial-parallel combined structure.

As comparing FIG. 9, FIG. 10, FIG. 11 and FIG. 12, it may be seen that an outlet temperature is lowest in the structures of FIG. 11 and FIG. 12, and a deviation in parallel module is lowest in the structure of FIG. 12. Therefore, the serial-parallel combined structure of FIG. 12 is most efficient, and when compared with the conventional parallel structure, the serial-parallel combined structure of FIG. 12 may reduce a temperature and heat resistance at an outlet portion.

The present invention relates to a cooling structure for cooling a parallel type power module and proposes a cooling module employing a serial-parallel combined cooling method having a type the same as that shown in FIG. 12.

Figure 13:
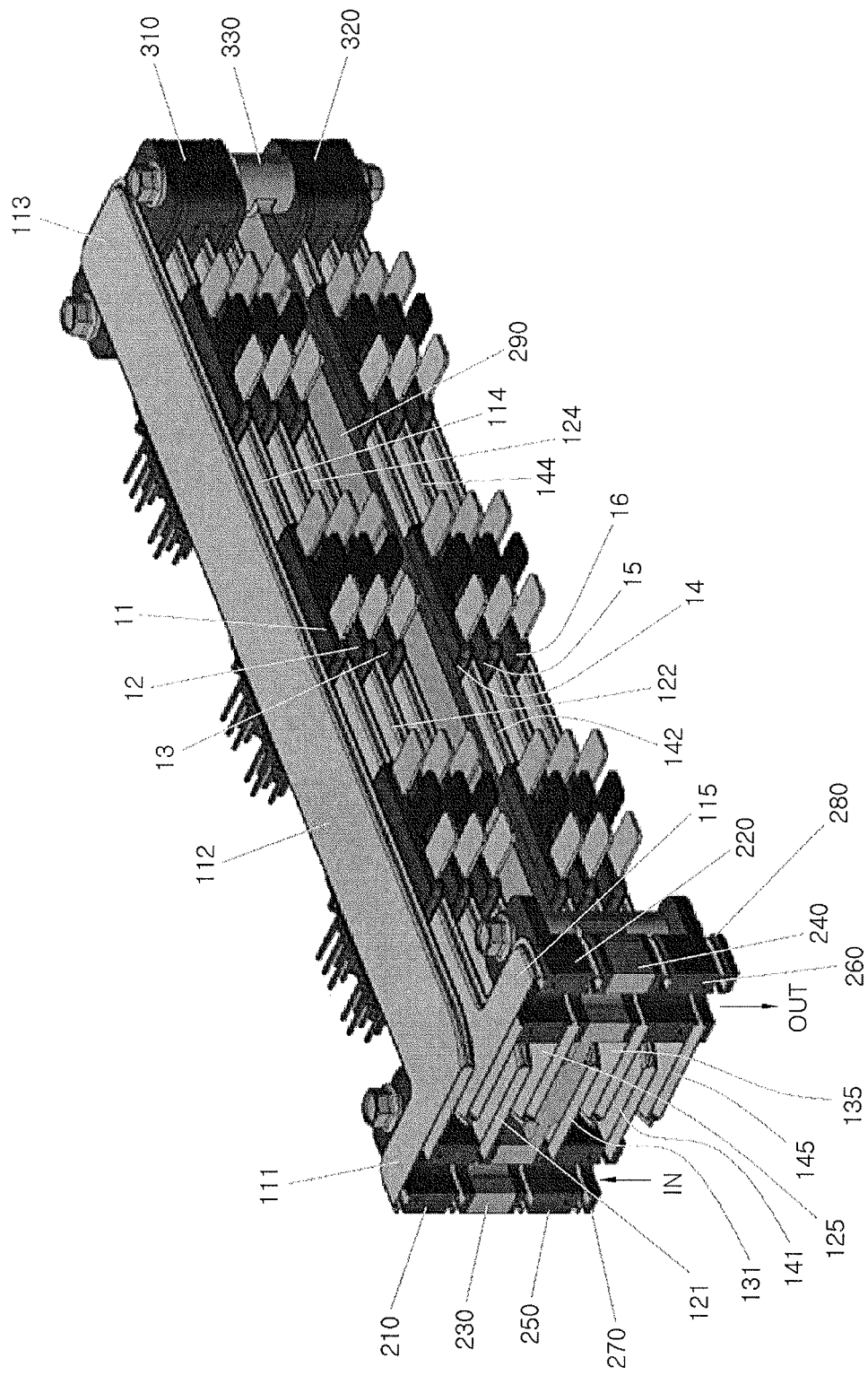
FIG. 13 and FIG. 14 are diagrams illustrating a cooling module according to an exemplary embodiment of the present invention.
Figure 14:
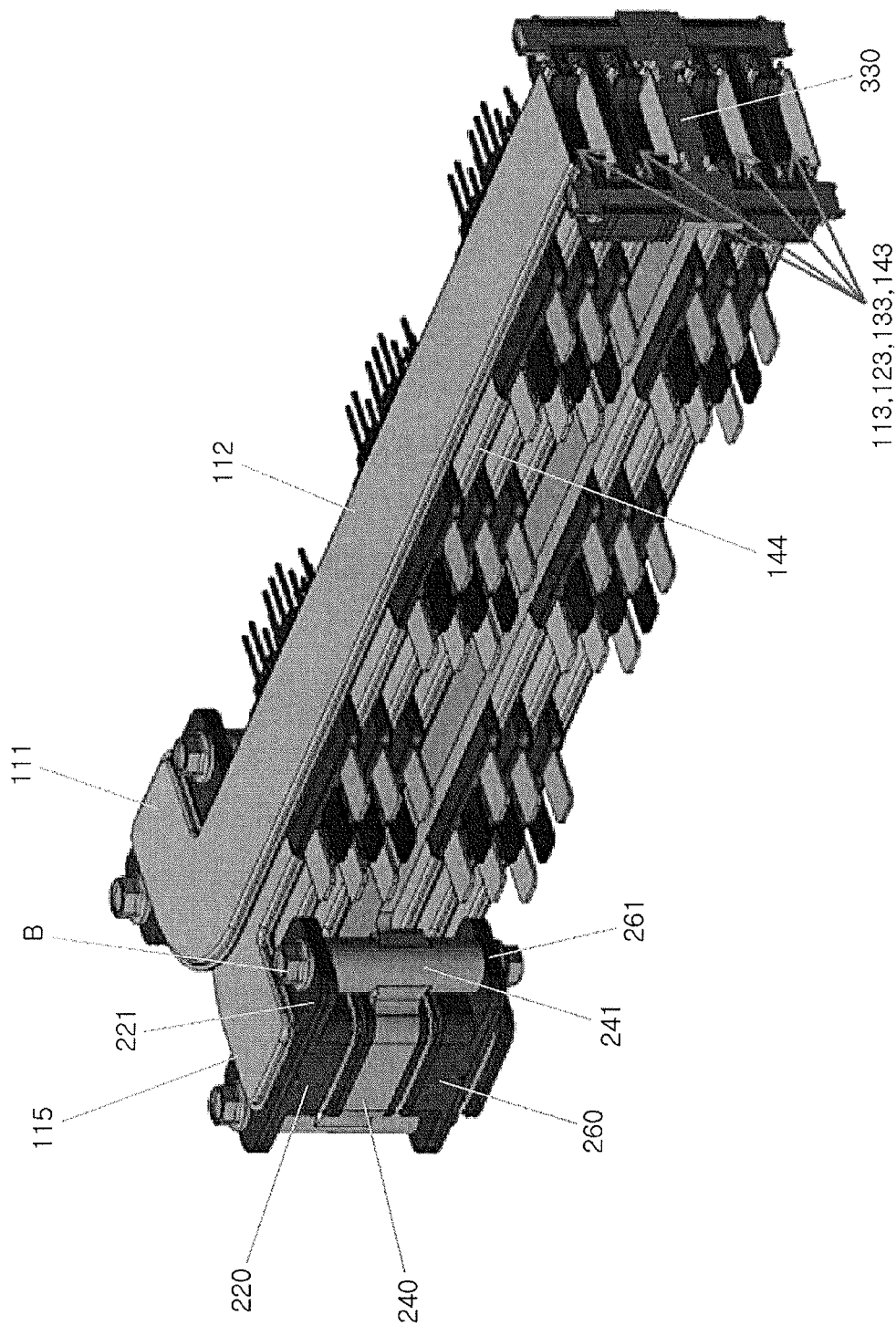
Figure 15:
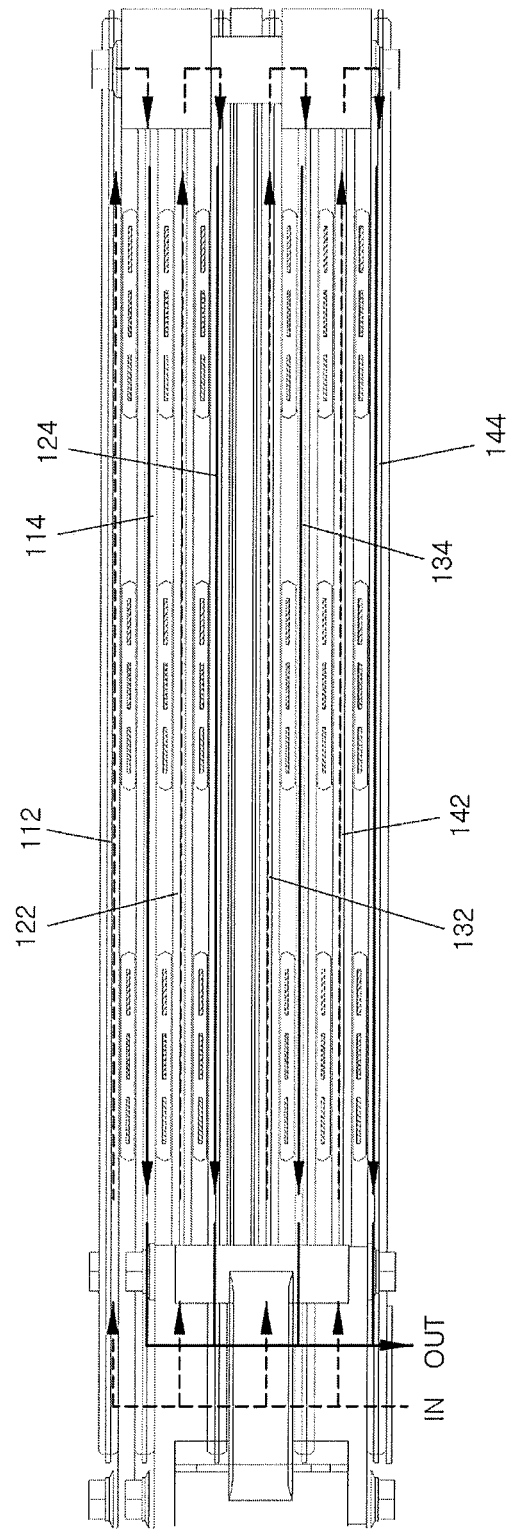
FIG. 15 is a diagram illustrating a flow of cooling water through a side surface shape of the cooling module according to an exemplary embodiment of the present invention.

FIG. 13 and FIG. 14 are diagrams illustrating a cooling module according to an exemplary embodiment of the present invention, and FIG. 15 is a diagram illustrating a flow of cooling water through a side surface shape of the cooling module according to an exemplary embodiment of the present invention.

Figure 3:
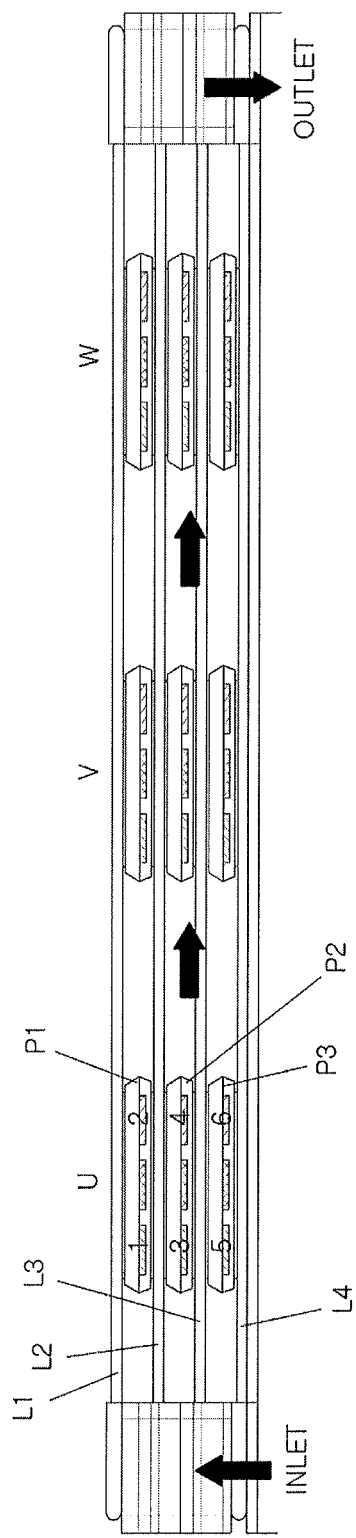
FIG. 3 is a diagram illustrating a conventional cooling method according to a parallel type power module.
Figure 4:
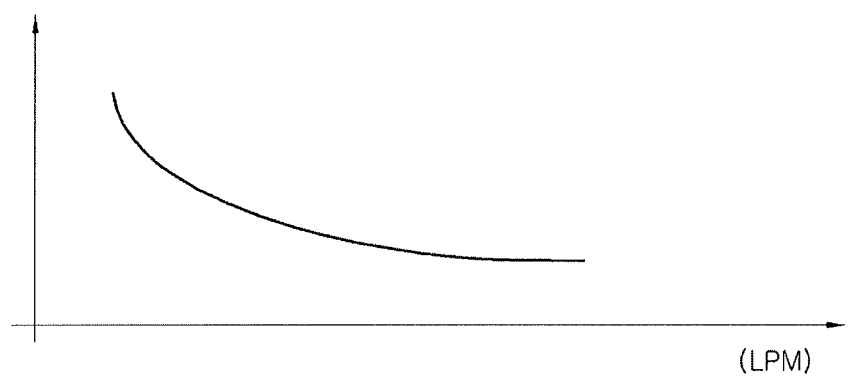
FIG. 4 and FIG. 5 are graphs for describing problems of the conventional cooling method of FIG. 3.
Figure 5:
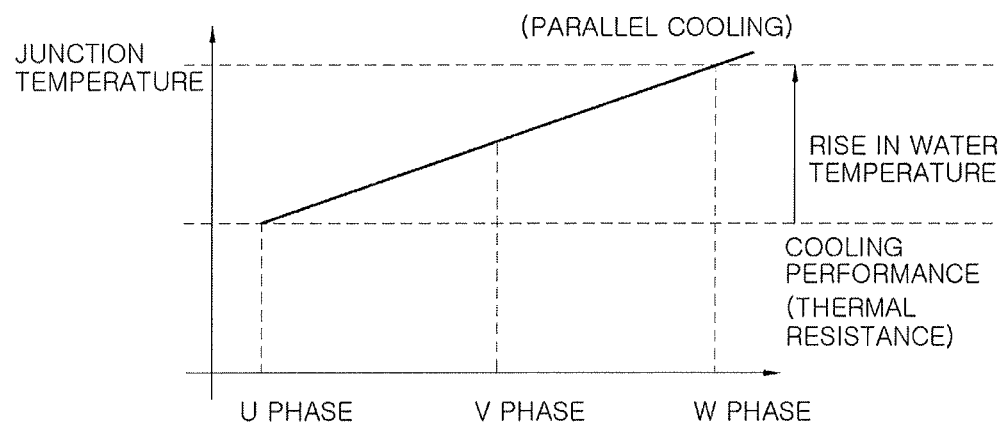

An exemplary cooling module may be applied to six parallel-driven power modules, and a conventional cooling module for the six parallel-driven power modules may be an eight-parallel type cooling module as shown in FIG. 3.

Various aspects of the present invention are directed to providing a four-serial-parallel combined type cooling module for six parallel-driven power modules.

The four-serial-parallel combined type means that four cooling water passages, each of which has a serial configuration, are configured in parallel.

A cooling module according to an exemplary embodiment of the present invention is provided for power modules 11, 12, 13, 14, 15, and 16 (corresponding to only a V phase are shown) are configured in six rows in parallel by being respectively corresponded U, V, and W phases of an inverter.

For convenience, a power module disposed at an uppermost position of the drawing is referred to as a first row power module and a power module disposed below the first row power module is referred to as a second row power module, and a description will be made according to an order of the first row power module and the second row power module.

A cooling water passage is in contact with an upper surface and a lower surface of each of the six-row power modules 11, 12, 13, 14, 15, and 16 and thus the six-row power modules 11, 12, 13, 14, 15, and 16 are cooled by the cooling water passages such that four-row parallel type cooling water passages are configured in parallel.

As such, support blocks for supporting the four-row parallel type cooling water passages are configured, and the cooling module is configured according to a method of assembling the support blocks.

A first cooling water passage is configured with a first inlet passage 111 through which cooling water flows in, a first upper cooling passage 112 communicating with the first inlet passage 111 and brought into contact with an upper surface of each of a plurality of first row power modules 11, a first U-turn passage 113 communicating in a downward direction from a distal end portion of the first upper cooling passage 112, a first lower cooling passage 114 communicating from the first U-turn passage 113 and brought into contact with a lower surface of each of the plurality of first row power modules 11 and an upper surface of each of a plurality of second row power modules 12, and a first outlet passage 115 communicating from a distal end portion of the first lower cooling passage 114 and through which the cooling water flows out.

Next, a second cooling water passage is configured with a second inlet passage 121 through which the cooling water flows in, a second upper cooling passage 122 communicating with the second inlet passage 121 and brought into contact with a lower surface of each of the plurality of second row power modules 12 and an upper surface of each of a plurality of third row power modules 13, a second U-turn passage 123 communicating in downward direction from a distal end portion of the second upper cooling passage 122, a second lower cooling passage 124 communicating from the second U-turn passage 123 and brought into contact with a lower surface of each of the plurality of third row power modules 13, and a second outlet passage 125 communicating from a distal end portion of the second lower cooling passage 124 and through which the cooling water flows out.

A third cooling water passage is configured with a third inlet passage 131 through which the cooling water flows in, a third upper cooling passage 132 communicating with the third inlet passage 131 and brought into contact with an upper surface of each of a plurality of fourth row power modules 14, a third U-turn passage 133 communicating in a downward direction from a distal end portion of the third upper cooling passage 132, a third lower cooling passage 134 communicating from the third U-turn passage 133 and brought into contact with a lower surface of each of the plurality of fourth row power modules 14 and an upper surface of each of a plurality of fifth row power modules 15, and a third outlet passage 135 communicating from a distal end portion of the third lower cooling passage 134 and through which the cooling water flows out.

Next, a fourth cooling water passage is configured with a fourth inlet passage 141 through which the cooling water flows in, a fourth upper cooling passage 142 communicating with the fourth inlet passage 141 and brought into contact with a lower surface of each of the plurality of second row power modules 15 and an upper surface of each of a plurality of sixth row power modules 16, a fourth U-turn passage 143 communicating in a downward direction from a distal end portion of the fourth upper cooling passage 142, a fourth lower cooling passage 144 communicating from the fourth U-turn passage 143 and brought into contact with a lower surface of each of the plurality of sixth row power modules 16, and a fourth outlet passage 145 communicating from a distal end portion of the fourth lower cooling passage 144 and through which the cooling water flows out.

Since the cooling water passages, each of which has the serial configuration, are configured in parallel, an inlet hole IN and an outlet hole OUT are configured on the same one side of the cooling module, the inlet passages 111, 121, 131, and 141 are distributed through the single inlet hole IN and thus the cooling water flows in, the cooling water flowing from the outlet passages 115, 125, 135, 145, and 155 flows out through the single outlet hole OUT.

Therefore, as shown in the drawings, the inlet passage and the outlet passage are disposed opposite to each other about the upper cooling passage or the lower cooling passage such that the inlet passage is bent to communicate with the upper cooling passage, and the outlet passage is bent to communicate with the lower cooling passage.

A support block is assembled to support the cooling water passages, and the support block is provided at each of an inlet side and an outlet side on the inlet hole IN and the outlet hole OUT.

A first inlet side support block 210 has an inlet hole formed to vertically pass through the first inlet side support block 210, and the first inlet side support block 210 supports the first inlet passage 111 on an upper surface thereof.

A second inlet side support block 230 has an inlet hole formed to vertically pass through the second inlet side support block 230, and the second inlet side support block 230 supports the second inlet passage 121 on an upper surface thereof.

A third inlet side support block 250 has an inlet hole formed to vertically pass through the third inlet side support block 250, and the third inlet side support block 250 supports the third inlet passage 131 on an upper surface thereof.

A fourth inlet side support block 270 has an inlet hole formed to vertically pass through the fourth inlet side support block 270, and the fourth inlet side support block 270 supports the fourth inlet passage 141 on an upper surface thereof.

The inlet holes formed at the first inlet side support block 210, the second inlet side support block 230, the third inlet side support block 250, and the fourth inlet side support block 270 pass through each other to form the single inlet hole IN, and the first inlet passage 111, the second inlet passage 121, the third inlet passage 131, and the fourth inlet passage 141 communicate from upper surfaces of the first inlet side support block 210, the second inlet side support block 230, the third inlet side support block 250, and the fourth inlet side support block 270.

Next, a first outlet side support block 220 has an outlet hole formed to vertically pass through the first outlet side support block 220, and the first outlet side support block 220 supports the first outlet passage 115 on an upper surface thereof.

A second outlet side support block 240 has an outlet hole formed to vertically pass through the second outlet side support block 240, and the second outlet side support block 240 supports the second outlet passage 125 on an upper surface thereof.

A third outlet side support block 260 has an outlet hole formed to vertically pass through the third outlet side support block 260, and the third outlet side support block 260 supports the third outlet passage 135 on an upper surface thereof.

A fourth outlet side support block 280 has an outlet hole formed to vertically pass through the fourth outlet side support block 280, and the fourth outlet side support block 270 supports the fourth outlet passage 145 on an upper surface thereof.

The inlet holes formed at the first outlet side support block 220, the second outlet side support block 240, the third outlet side support block 260, and the fourth outlet side support block 280 pass through each other to form the single outlet hole OUT, and the first outlet passage 115, the second outlet passage 125, the third outlet passage 135, and the fourth outlet passage 145 communicate from upper surfaces of the first outlet side support block 220, the second outlet side support block 240, the third outlet side support block 260, and the fourth outlet side support block 280.

In a configuration of such a six or more parallel type power module, a suitable inlet side support block and an outlet side support block corresponding to the suitable inlet side support block may be integrally formed to support the six or more parallel type power module in a vertical direction thereof.

For example, the second inlet side support block 230 and the second outlet side support block 240 are integrally formed by being connected to each other, forming middle blocks 230 and 240, and the middle blocks 230 and 240 are integrally formed with a middle cover 290 extending in a longitudinal direction of the cooling module.

Due to a configuration of the middle cover 290, rigidity of the parallel-disposed power module may be secured in the vertical direction such that the middle cover 290 supports between the third row power module 13 and the fourth row power module 14.

Next, a U-turn side support block is configured to support the cooling water passages on a side opposite to the inlet side support block and the outlet side support block.

A first U-turn side support block 310 supports the first upper cooling passage 112, the first lower cooling passage 114, and the second upper cooling passage 122, and the first U-turn side support block 310 is divided into an upper space and a lower space. The first U-turn passage 113 is formed in the upper space, the second U-turn passage 123 is formed in the lower space, and the first U-turn passage 113 and the second U-turn passage 123 may communicate with each other.

A second U-turn side support block 320 supports the third upper cooling passage 132, the third lower cooling passage 134, and the fourth upper cooling passage 142, and the second U-turn side support block 320 is divided into an upper space and a lower space. The third U-turn passage 133 is formed in the upper space, the fourth U-turn passage 143 is formed in the lower space, and the third U-turn passage 133 and the fourth U-turn passage 143 may communicate with each other.

Furthermore, a U-turn side middle block 330 is configured to support the second lower cooling passage 124 and is connected to one end portion of the middle cover 290.

The above-described support blocks are stacked and assembled to form the cooling module, and to assemble the above-described support blocks, flanges 221 and 261 having bolting holes are formed at the first outlet side support block 220 and the third outlet side support block 260 and further are formed at the first inlet side support block 210 and the third inlet side support block 250.

Furthermore, a bolting pipe 241 is formed at the second outlet side support block 240 and is assembled by a bolt B in a state of being disposed in line with the bolting holes formed at the flanges 221 and 261.

The bolting pipe 241 is also formed at the second inlet side support block 230 and assembled through the above-described assembly method, and as shown in the drawing, the bolting pipe 241 may be double bolted to the inlet side and the outlet side thereof.

Furthermore, through holes are also formed at the first and second U-turn side support blocks 310 and 320 and the U-turn side middle block 330 such that the first and second U-turn side support blocks 310 and 320 and the U-turn side middle block 330 are assembled by bolts.

Figure 16:
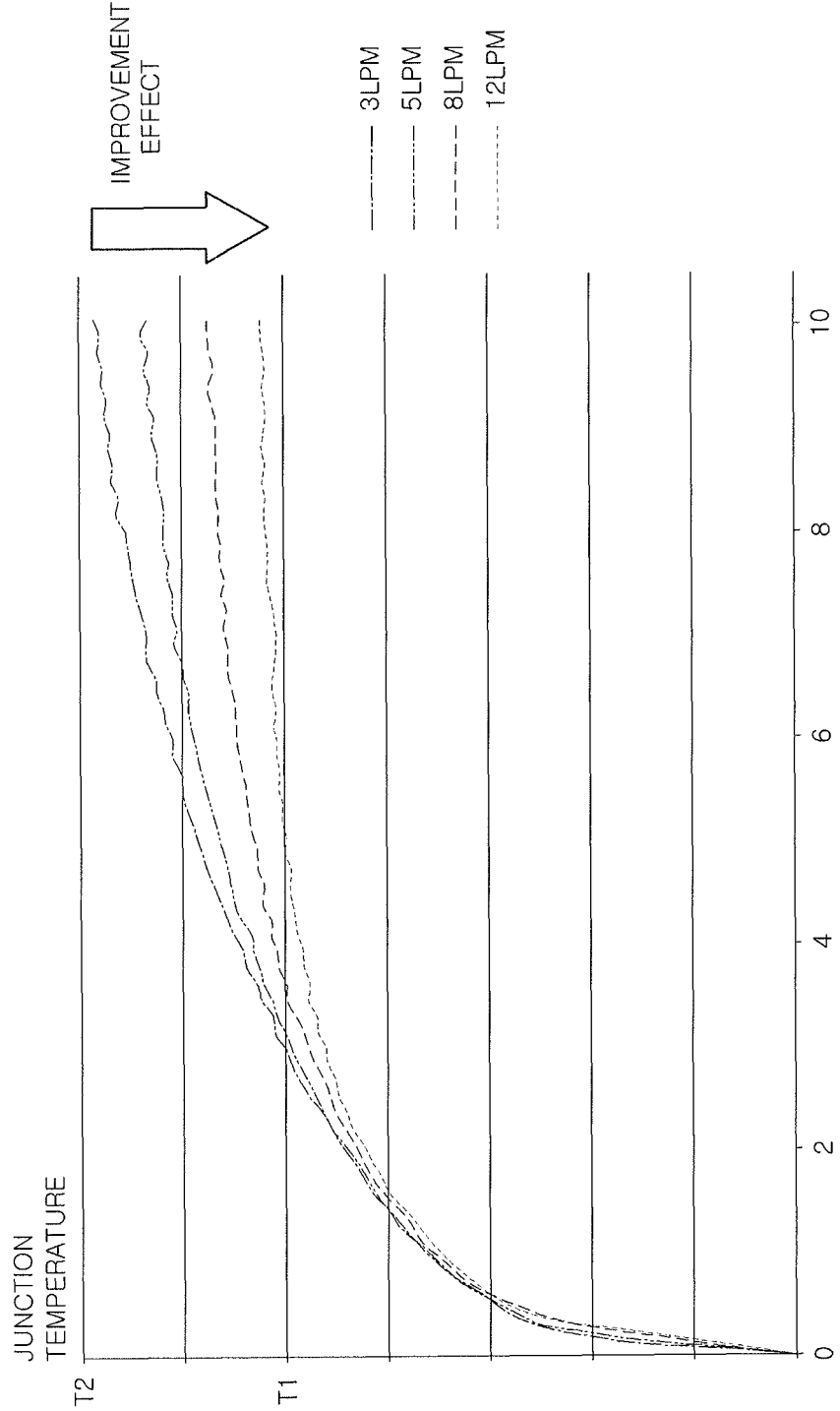
FIG. 16 and FIG. 17 are graphs showing an effect of improvement by the cooling module of the present invention.
Figure 17:
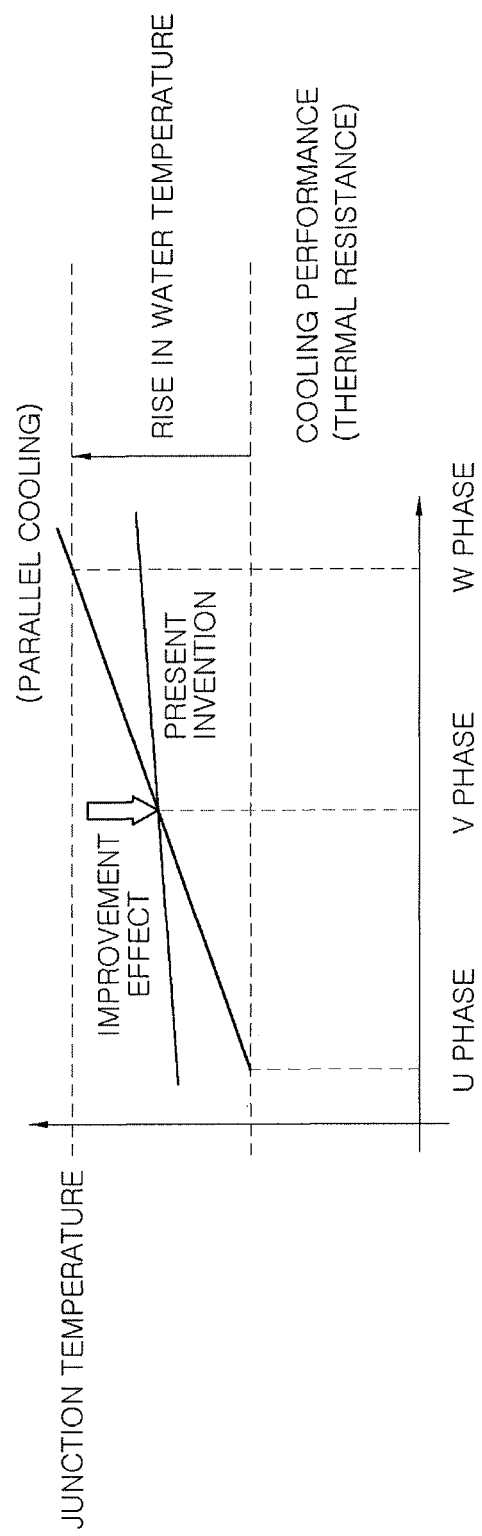

FIG. 16 and FIG. 17 are graphs showing an effect of improvement by the above-described cooling module of the present invention.

As may be seen from the drawings, thermal resistance may be reduced gradually from about T2 to about T1(T2>T1) as the LPM increases according to the cooling module of the present invention. When the cooling modules are configured in parallel according to a related art, the LPM flowing through each of the cooling passages is significantly reduced, resulting in a rise in thermal resistance. Therefore, the thermal resistance may be reduced by increasing the LPM through a serial-parallel combined structure.

Furthermore, the influence of a rise in water temperature may be minimized (balancing).

When the cooling modules are configured in parallel according to the related art, water temperature at an outlet side rises to cause limitation of an output, but according to an exemplary embodiment of the present invention, an output may be increased through balancing of a rise in water temperature at the inlet and the outlet.

Furthermore, since manageable current per cooling module increases, the number of power modules forming the parallel type power module may be reduced, and thus the cost of a complete product may be reduced.

In accordance with a cooling module for a parallel type power module of an inverter according to an exemplary embodiment of the present invention, it is possible to increase a flow rate LPM per cooling water passage for cooling the parallel type power module and to reduce thermal resistance as the LPM increases.

Furthermore, it is possible to minimize (equalizing) the influence of a rise in water temperature with respect to each phase, and thus an output may be increased.

Therefore, since a manageable current per cooling module increases, the number of power modules forming the parallel type power module may be reduced, and thus the cost of a complete product may be reduced.

For convenience in explanation and accurate definition in the appended claims, the terms "upper", "lower", "inner", "outer", "up", "down", "upper", "lower", "upwards", "downwards", "front", "rear", "back", "inside", "outside", "inwardly", "outwardly", "internal", "external", "inner", "outer", "forwards", and "backwards" are used to describe features of the exemplary embodiments with reference to the positions of such features as displayed in the figures.

The foregoing descriptions of specific exemplary embodiments of the present invention have been presented for purposes of illustration and description. They are not intended to be exhaustive or to limit the present invention to the precise forms disclosed, and obviously many modifications and variations are possible in light of the above teachings. The exemplary embodiments were chosen and described to explain certain principles of the present invention and their practical application, to enable others skilled in the art to make and utilize various exemplary embodiments of the present invention, as well as various alternatives and modifications thereof. It is intended that the scope of the present invention be defined by the Claims appended hereto and their equivalents.

What is claimed is:

1. A cooling module apparatus for parallel type power modules of an inverter, the cooling module apparatus comprising:
    the parallel type power modules mounted in three or more columns and three or more rows, wherein three parallel type power modules of the parallel type power modules are mounted to correspond to U, V, and W phases of the inverter in the three or more rows in each of the three or more columns;
    a first cooling water passage having a passage through which cooling water flows and contacting with an upper surface and a lower surface of a power module mounted at a first row of the three or more rows among the parallel type power modules; and
    a second cooling water passage having a passage through which the cooling water flows and contacting an upper surface and a lower surface of a power module mounted at a third row of the three or more rows among the parallel type power modules,
    wherein the first cooling water passage contacts and upper surface of a power module mounted at a second row of the three or more rows among the parallel type power modules, and the second cooling water passage contacts a lower surface of the power module mounted at the second row, and
    wherein the first cooling water passage includes:
        a first inlet passage through which the cooling water flows in;
        a first upper cooling passage fluidically-communicating with the first inlet passage and contacting the upper surface of the power module mounted at the first row;
        a first U-turn passage fluidically-communicating in a downward direction from a distal end portion of the first upper cooling passage;
        a first lower cooling passage fluidically-communicating from the first U-turn passage and contacting the lower surface of the power module mounted at the first row and the upper surface of the power module mounted at the second row; and
        a first outlet passage fluidically-communicating from a distal end portion of the first lower cooling passage and through which the cooling water flows out.

2. The cooling module apparatus of claim 1, wherein the second cooling water passage includes:
    a second inlet passage through which the cooling water flows in;
    a second upper cooling passage fluidically-communicating with the second inlet passage and contacting the lower surface of the power module mounted at the second row and the upper surface of the power module mounted at the third row;
    a second U-turn passage fluidically-communicating in a downward direction from a distal end portion of the second upper cooling passage;
    a second lower cooling passage fluidically-communicating from the second U-turn passage and contacting the upper surface of the power module mounted at the third row; and
    a second outlet passage fluidically-communicating from a distal end portion of the second lower cooling passage and through which the cooling water flows out.

3. The cooling module apparatus of claim 2, wherein the first inlet passage and the second inlet passage fluidically-communicate with each other through a same inlet hole, and the first outlet passage and the second outlet passage fluidically-communicate with each other through a same outlet hole.

4. The cooling module apparatus of claim 2, wherein the same inlet hole and the same outlet hole are formed on a same side of the cooling module apparatus.

5. The cooling module apparatus of claim 3, wherein the first inlet passage fluidically-communicates with the first upper cooling passage, the second inlet passage fluidically-communicates with the second upper cooling passage, the first outlet passage fluidically-communicates with the first lower cooling passage, and the second outlet passage fluidically-communicates with the second lower cooling passage.

6. The cooling module apparatus of claim 3, further including:
    a first inlet side support block supporting the first inlet passage on an upper surface thereof;
    a second inlet side support block supporting the second inlet passage on an upper surface thereof;
    a first outlet side support block supporting the first outlet passage on an upper surface thereof; and
    a second outlet side support block supporting the second outlet passage on an upper surface thereof,
    wherein the same inlet hole is formed in the first inlet side support block and the second inlet side support block, and the same outlet hole is formed in the first outlet side support block and the second outlet side support block.

7. The cooling module apparatus of claim 6, wherein the first inlet side support block, the second inlet side support block, the first outlet side support block, and the second outlet side support block are formed on a same side of the cooling module apparatus.

8. The cooling module apparatus of claim 6, wherein the second inlet side support block and the second outlet side support block are integrally formed.

9. The cooling module apparatus of claim 6, further including:
    a U-turn side support block supporting the first upper cooling passage, the first lower cooling passage, and the second upper cooling passage, and including an upper space and a lower space, wherein the first U-turn passage is formed in the upper space of the first U-turn side support block and the second U-turn passage is formed in the lower space of the first U-turn side support block.

10. The cooling module apparatus of claim 9, further including:
    a U-turn side middle block supporting the second lower cooling passage.

11. The cooling module apparatus of claim 3, wherein the three or more rows of the parallel type power modules includes six row, and
    wherein the cooling module apparatus further includes:
        a third cooling water passage having a passage through which the cooling water flows and contacting with an upper surface and a lower surface of a power module mounted at a fourth row of the six rows among the parallel type power modules; and
        a fourth cooling water passage having a passage through which cooling water flows and contacting with an upper surface and a lower surface of a power module mounted at a sixth row of the six rows among the parallel type power modules.

\* \* \* \* \*